United States Patent
Abe et al.

(10) Patent No.: US 6,346,354 B1
(45) Date of Patent: Feb. 12, 2002

(54) PATTERN WRITING METHOD

(75) Inventors: Takayuki Abe; Hirohito Anze; Susumu Oogi, all of Kawasaki; Mitsuko Shimizu, Machida; Hideo Inoue; Takashi Saito, both of Numazu; Toru Tojo, Naka-gun; Takashi Kamikubo, Kawasaki; Yoshiaki Hattori, Tokyo; Tomohiro Iijima, Kawasaki; Noriaki Nakayamada, Yokohama, all of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/533,265

(22) Filed: Mar. 20, 2000

(30) Foreign Application Priority Data

Mar. 19, 1999 (JP) ............................................ 11-076585

(51) Int. Cl.[7] .............................. G03F 9/00; G03C 5/00
(52) U.S. Cl. .......................... 430/30; 430/296; 430/942
(58) Field of Search ........................... 430/30, 296, 942

(56) References Cited

U.S. PATENT DOCUMENTS

| 5,008,553 A | 4/1991 | Abe ........................ 250/492.2 |
| 5,305,225 A | 4/1994 | Yamaguchi et al. | |
| 5,451,487 A | 9/1995 | Abe et al. .................... 430/296 |
| 5,863,682 A | 1/1999 | Abe et al. ..................... 430/30 |

OTHER PUBLICATIONS

M. Parikh, "Corrections to Proximity Effects in Electron Beam Lithography", J. Appl. Phys., vol. 50, No. 6, pp. 4371–4387, (1979).

T. Abe et al., "Representative Figure Method for Proximity Effect Correction [II]", Japanese Journal of Applied Physics, vol. 30, No. 11A, pp. 2965–2969, (1991).

T. Abe, "Reticle Fabrication by High Acceleration Voltage Electron Beam: Representative Figure Method for Proximity Effect Correction [VI]", Journal of Vacuum Science & Technology B, Second Series, vol. 14, No. 4, pp. 2474–2484, (1996).

*Primary Examiner*—Christopher G. Young
(74) *Attorney, Agent, or Firm*—Finnegan, Henderson, Farabow, Garrett, & Dunner, L.L.P.

(57) ABSTRACT

A pattern writing method acquires the area of a pattern segment located in each of a plurality of small regions obtained by dividing a region on which a pattern is to be written, small region by small region, and writes a pattern based on an optimum dose calculated based on this area. This method employs a scheme of shifting pattern segments and averaging the accumulated area, so that even when the pitch of repetitive patterns slightly differs from the side length of each small region in the pitch direction, a peculiar error does not occur, thereby ensuring highly-precise proximity effect correction and contributing to improving the precision of writing an LSI pattern.

10 Claims, 9 Drawing Sheets

FIG. 1A
(PRIOR ART)

LSI PATTERN

FIG. 1B
(PRIOR ART)

AREA DIVISION

| 1.5 | 0.5 |  |  |
|---|---|---|---|
| 1.5 | 0.5 |  |  |
| 2 | 1.5 |  |  |
| 0 | 0.5 |  |  |

CALCULATED AREA SIZE

FIG. 1C
(PRIOR ART)

| 1.0 | 0.8 |  |  |
|---|---|---|---|
| 1.5 | 1.0 |  |  |
| 1 | 1.0 |  |  |
| 1 | 1 |  |  |

CONVOLUTION VALUE

FIG. 1D
(PRIOR ART)

| 2 | 2.5 |  |  |
|---|---|---|---|
| 1.5 | 2.0 |  |  |
| 2 | 2.0 |  |  |
|  | 2 |  |  |

OPTIMUM DOSE

FIG. 1E
(PRIOR ART)

ORIGINAL PATTERN

FIG. 2A

DIVISION INTO SMALL AREAS

FIG. 2B

EQUIVALENT PATTERN AFTER DIVISION

| 0 | 0 | 0 |
|---|---|---|
| c | d | 0 |
| a | b | 0 |

FIG. 14C

| 0 | g | h |
|---|---|---|
| 0 | e | f |
| 0 | 0 | 0 |

FIG. 14D

| 0 | g/2 | h/2 |
|---|---|---|
| c/2 | (d+e)/2 | f/2 |
| a/2 | b/2 | 0 |

FIG. 14E

PATTERN WRITING METHOD

CROSS-REFERENCE TO RELATED APPLICATIONS

This application is based upon and claims the benefit of priority from the prior Japanese Patent Application No. 11-076585, filed Mar. 19, 1999, the entire contents of which are incorporated herein by reference.

BACKGROUND OF THE INVENTION

The present invention relates to a pattern writing technique for writing the pattern of an LSI or the like, and, more particularly, to a pattern writing method and pattern writing system which write a pattern by correcting a proximity effect.

In writing the pattern of an LSI using an electron-beam writing system, the backward scattering of the beam causes a so-called proximity effect. The proximity effect changes or degrades the size precision of a resist depending on, for example, the designed size of the pattern or the presence of a peripheral pattern.

A dose correction method is one way of correcting this proximity effect. This method corrects an error by changing the dose of the electron beam in accordance with the target position and has been used in directly writing a pattern on a wafer. In this method, the optimum dose is computed by software using a general-purpose computer provided outside an EB (Electron Beam) system. At this time, the results of the calculation or the like are checked outside the EB system after which data on the dose of the electron beam is input to the EB system to be used in writing a pattern.

The recent ever-increasing integration of LSI patterns makes the influence of the proximity effect greater, so that the technology of proximity effect correction becomes more and more essential. For instance, the dose of the electron beam that is effectively emitted on the resist is the amount of forward scattering electrons plus the amount of backward scattering electrons which is the beam reflected at the surface of the substrate to be processed. Therefore, proximity effect correction should consider the amount of backward scattering electrons.

One conventional way of correcting proximity effect in an electron-beam writing method is to segment the writing area of an LSI pattern into small regions, acquire the area of each small region, obtain the amount of backward scattering electrons based on that area of each small region and then acquire the optimum dose from this amount of backward scattering electrons (see, for example, Takayuki Abe et al. "Representative Figure Method for Proximity Effect Correction [ii]" Japanese Journal of Applied Physics Vol. 30, No. 11A, November, 1991, pp. 2965–2969).

The present inventors discovered through intensive studies that a peculiar error occurs when there are repetitive patterns whose pitch slightly differs from the side length of each small region in the pitch direction. This problem is inherent not only to electron beam writing but also to ion beam writing.

BRIEF SUMMARY OF THE INVENTION

Accordingly, it is an object of the present invention to provide a pattern writing method and pattern writing system which can implement highly-precise proximity effect correction even when there are repetitive patterns whose pitch slightly differs from the side length of each small region in the pitch direction, and can thus contribute to improving the writing precision.

To achieve the above object, a pattern writing method according to the first aspect of this invention comprises the steps of:

dividing a region of a to-be-exposed substrate on which a pattern is to be written into a plurality of small regions;

relatively shifting coordinates of the pattern and the plurality of small regions n times (n: an integer equal to or greater than 2) within a shift range whose absolute value is smaller than a size of the plurality of small regions and computing an area of at least one portion of the pattern located in each of the plurality of small regions in each of the n times, thereby acquiring n pieces of area data;

computing an optimum dose for the at least one portion of the pattern based on the n pieces of area data; and writing the pattern on the to-be-exposed substrate based on the optimum dose.

The following are preferable embodiments of this pattern writing method.

The optimum-dose computing step includes the step of computing an amount of backward scattering electrons based on the n pieces of area data.

The backward-scattering-electrons-amount computing step includes the step of computing the amount of backward scattering electrons by convolution based on the n pieces of area data and spreading of backward scattering.

The backward-scattering-electrons-amount computing step computes the amount of backward scattering electrons by an equation given below based on the area:

$$U(x) = \int S(x') \exp\{-(x''x')^2/\eta\sigma b^2\} dx'$$

where $U(x)$ is the amount of backward scattering electrons, $S(x')$ is the area, $x$ and $x'$ are coordinates and $\sigma b$ is spreading of backward scattering.

The optimum-dose computing step computes the optimum dose by an equation given below based on the amount of backward scattering electrons:

$$D(x) = C/(\tfrac{1}{2} + \eta U(x))$$

where $D(x)$ is the optimum dose, $\eta$ is a ratio of an exposure amount sensitive to a resist by forward scattering electrons to that by backward scattering electrons and $C$ is a constant.

The optimum-dose computing step includes the steps of:

multiplying each of the n pieces of area data by $1/n$ and then adding resultant areas together to thereby acquire an added area; and computing the optimum dose based on an amount of backward scattering electrons acquired based on the added area.

The optimum-dose computing step may include the steps of:

adding n amounts of backward scattering electrons respectively obtained based on the n pieces of area data to thereby acquire an added amount of backward scattering electrons; and computing the optimum dose by multiplying the added amount of backward scattering electrons by $1/n$.

The plurality of small regions are rectangles of a same size which satisfy $$0 \leq dx \leq lx$$

and $$0 \leq dy \leq ly$$

where lx is a length of x-axial sides, ly is a length of y-axial sides perpendicular to the y-axial sides, dx is an absolute value of an amount of a relative shift of each of the plurality of small regions in an x-axial direction and dy is an absolute value of an amount of a relative shift of each of the plurality of small regions in a y-axial direction.

The total of absolute values of amounts of n relative shifts is equal to or smaller than lx/2 in the x-axial direction and is equal to or smaller than ly/2 in the y-axial direction.

In this pattern writing method, n is an even number and a total of the amounts of the n shifts in at least one of the x-axial direction and the y-axial direction is zero.

A pattern writing system according to the second aspect of this invention comprises:

means for dividing a region of a to-be-exposed substrate on which a pattern is to be written into a plurality of small regions and computing an area of a pattern segment located in each of the plurality of small regions;

means for relatively shifting coordinates of the pattern and the plurality of small regions within a range smaller than a size of the plurality of small regions;

means for accumulating the area of the pattern segment located in each of the plurality of small regions acquired for each shift, small region by small region; and means for computing an optimum dose based on the accumulated area of the pattern segment in each of the plurality of small regions.

It is desirable that the optimum-dose acquisition means includes convolution means for computing an amount of backward scattering electrons based on the accumulated area of the pattern segment in each of the plurality of small regions.

A pattern writing system according to the third aspect of this invention comprises:

a figure division section for dividing a region of a to-be-exposed substrate on which a pattern is to be written into a plurality of small regions;

an area accumulation section for relatively shifting coordinates of the pattern and the plurality of small regions within a range smaller than a size of the plurality of small regions, computing an area of a pattern segment located in each of the plurality of small regions shift by shift, and accumulating the area of the pattern segment located in each of the plurality of small regions acquired for each shift, small region by small region;

a convolution section for computing an amount of backward scattering electrons based on the accumulated area of the pattern segment in each of the plurality of small regions;

a dose calculation section for computing an optimum dose based on the amount of backward scattering electrons for each of the plurality of small regions; and an electron optics system for writing a pattern on the to-be-exposed substrate based on the optimum dose.

In the pattern writing systems according to the second and third aspects of this invention, it is desirable that the plurality of small regions are rectangles of a same size; and the shift means or the area accumulation section should carry out relative shifts in such a way as to satisfy $$0 \leq dx \leq lx$$

and $$0 \leq dy \leq ly$$

where lx is a length of x-axial sides, ly is a length of y-axial sides perpendicular to the y-axial sides, dx is an absolute value of an amount of each of the relative shifts of each of the plurality of small regions in an x-axial direction and dy is an absolute value of an amount of each of the relative shifts of each of the plurality of small regions in a y-axial direction.

It is desirable that the shift means or the area accumulation section performs the relative shifts in such a way that a total of absolute values of amounts of the relative shifts is equal to or smaller than lx/2 in the x-axial direction and is equal to or smaller than ly/2 in the y-axial direction.

It is further desirable that the shift means or the area accumulation section performs the relative shifts in such a way that a total of the amounts of the relative shifts in at least one of the x-axial direction and the y-axial direction is zero.

According to this invention, a pattern writing method acquires the area of a pattern segment located in each of a plurality of small regions obtained by dividing a region on which an LSI pattern is to be written, small region by small region, and writes a pattern based on an optimum dose calculated based on this area. This method employs a scheme of shifting pattern segments and averaging the accumulated area, so that even when the pitch of repetitive patterns slightly differs from the side length of each small region in the pitch direction, a peculiar error does not occur, thereby ensuring highly-precise proximity effect correction and contributing to improving the precision of writing an LSI pattern.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Preferred embodiments of the present invention will now be described with reference to the accompanying drawings.
(First Embodiment)

In the following description of the first embodiment, the gist of this invention will be discussed in comparison with the conventional proximity effect correction method. First, a description will be given of the proximity effect correction method that is believed to be the most effective at present and the problems this method has.

This proximity effect correction method is carried out in the following procedures (see FIGS. 1A–1C).

Figure 1A:
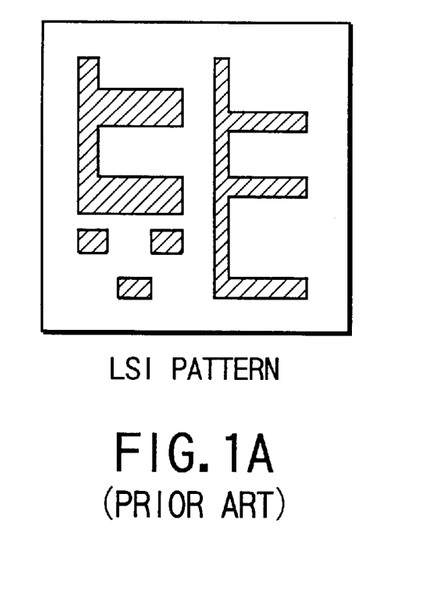
FIGS. 1A through 1E are exemplary diagrams for explaining a system which accomplishes proximity effect correction by dividing a pattern into small regions and computing the areas of pattern segments in the individual small regions.
Figure 1B:
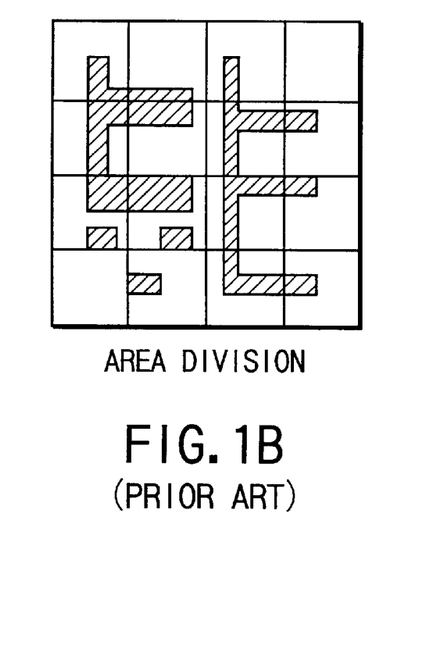
Figure 1C:
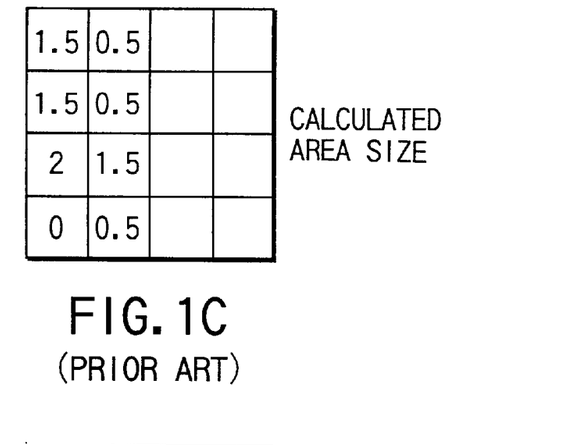

(1) An LSI pattern as shown in FIG. 1A is divided into a mesh of small regions as shown in FIG. 1B. The pitch of this mesh is smaller than each of subfields acquired by dividing a frame which is deflectable in the main deflection into writing units in the sub deflection. As shown in FIG. 1C, the inside area S of each small region is calculated.

Figure 1D:
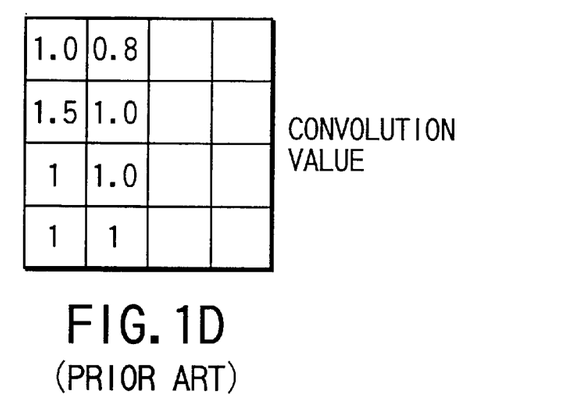

(2) As shown in FIG. 1D, convolution is carried out based on the area S of each small region, thereby yielding the amount of backward scattering electrons U(x).

$$U(x)=\int S(x')\exp\{-(x-x')^2/\sigma b^2\}dx' \quad (1)$$

where x and x' in the exponential term on the right-hand side of the equation are two-dimensional vectors (or coordinates) and σb is the spreading of backward scattering.

Figure 1E:
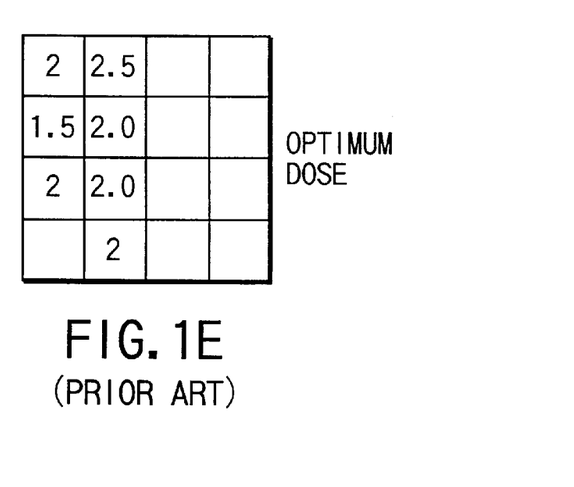

(3) As shown in FIG. 1E, an optimum dose D(x) is acquired from the amount of backward scattering electrons U(x).

$$D(x)=C/(\tfrac{1}{2}+\eta U(x)) \quad (2)$$

where η is the ratio of the exposure amount sensitive to a resist (effective dose) by forward scattering electrons to that by backward scattering electrons and C is a constant.

A system which provides a higher precision has been proposed (see Jpn. Pat. Appln. KOKAI Publication No. 8-36441).

Although the procedure (1) may use the center of gravity or barycenter of a pattern in each small region in addition to the area of that small region, it is easy to perform the method that uses only the area. This method is easily adapted to a proximity effect correction system (optimum dose calculation circuit) which uses an exclusive circuit or to software-based calculation of the optimum dose.

With regard to the above-described method, the present inventors conducted various experiments and made intensive studies and discovered that a peculiar error occurs when there are repetitive patterns whose pitch slightly differs from the side length of each small region in the pitch direction. This problem will be explained below referring to actual examples.

Let us consider an example where the small regions have a side length of 1.00 μm in the pitch direction, and proximity effect correction of a line and space (hereinafter referred to as "L/S") of 0.51 μm:0.51 μm is carried out to acquire the optimum dose. To simplify the description, we let the spreading of backward scattering σb be 5 μm and η be 1.0.

Figure 2A:
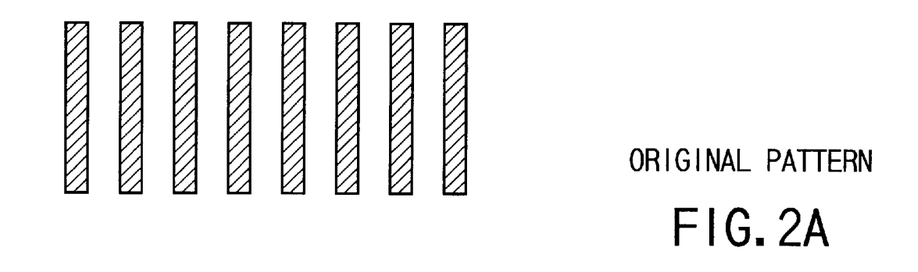
FIGS. 2A through 2C are exemplary diagrams for explaining an erroneous area recognition which occurs when the pitch of repetitive patterns slightly differs from the side length of each small region in the pitch direction.
Figure 2B:
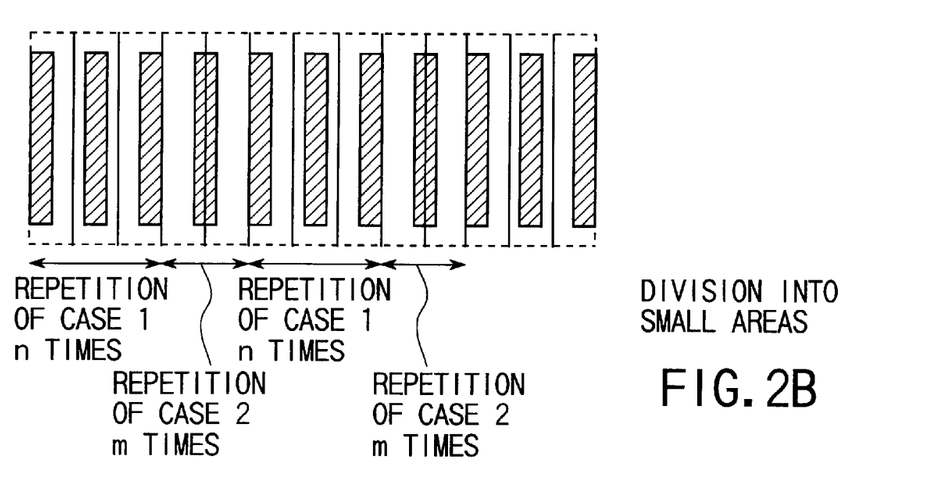

If an LSI pattern as shown in FIG. 2A is divided into small regions, the small regions have boundaries as shown in FIG. 2B. The repetitive pitch of L/S becomes 0.51 μm+0.51 μm=1.02 μm while the side length of each small region is 1.00 μm.

As seen from the left-hand side to the right-hand side in FIG. 2B, case 1 and case 2 are repeated. In case 1, a small region includes only one line (pattern portion) of 0.51 μm and this state is repeated n times. It is to be noted however that the position of the line in the small region is gradually shifted rightward.

In case 2, the boundary of small regions is located in the line of the line and space pattern and no boundary is located in the space, and this state continues m times. Subsequently, the state of case 1 starts again and is repeated n times. As apparent from the above, case 1 and case 2 are repeated alternately.

Figure 2C:
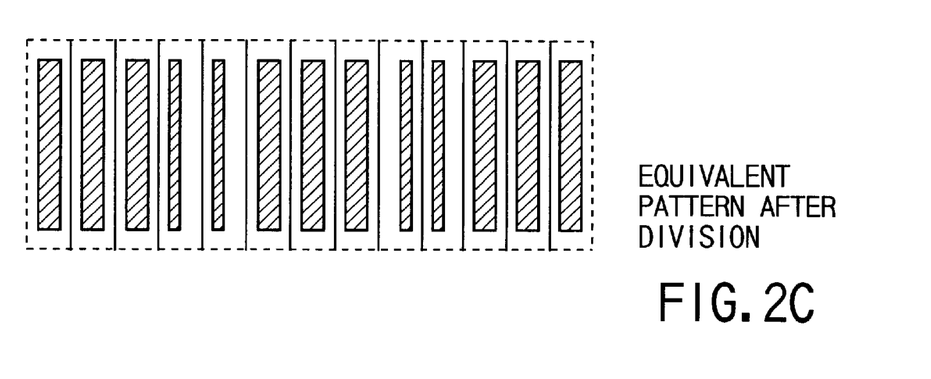

FIG. 2C represents the sizes of the line patterns belonging to small regions in FIG. 2B as an equivalent pattern. In case 1, a line pattern of a full size is included in each small region, whereas a narrower line pattern is included in each small region in case 2.

At the transition from case 1 to case 2 and the transition from case 2 to case 1, there is an intermediate state which will not be considered here for the sake of making the description simpler.

The number of small regions for which case 1 continues is acquired as follows. Assuming that the left edge pattern in the leftmost small region is in contact to the left boundary, the width of a pattern-less portion is the width of the small region minus the width of the line, i.e., 1.0 μm−0.51 μm=0.49 μm.

The difference between the pitch of L/S, 1.02 μm, and the pitch of the small region, 1.00 μm, is 0.02 μm. In a small region right to the leftmost small region, left edge of the pattern is separated rightward by 0.02 μm from the boundary at the left edge of the small region. Accordingly, the width of the region right to the pattern becomes 0.49 μm−0.02 μm=0.47 μm. When the width of the region right to the pattern becomes 0, the transition from case 1 to case 2 takes place.

Taking this point of view, there are 0.49 μm/0.02 μm=24.5 small regions in the region of case 1 so that 24 small regions are consecutively arranged. The length of this region in the pitch direction is 1.0 μm×24=24 μm. What is more, the density of a pattern to be recognized is 0.51 μm (the width of a line in a small region)/1.0 μm (the width of the small region)=0.51. The original density of a pattern where small regions are not considered is 0.50 because the line width is 0.51 μm and the space width is 0.51 μm.

As such a mismatch occurs in a wide region of 24 μm, the amount of backward scattering electrons (convolution value) U(x) becomes 0.51 at least in the center portion of this region due to the influence of the pattern density of 0.51 remaining there. Accordingly, the optimum dose D(x) becomes D(x)=C/(0.5+1×0.51)=C/1.01 from the equation 2. It is to be noted that η=1.

The optimum dose D(x) with respect to the original pattern density (0.50) becomes D(x)=C/(0.5+1×0.50)=C(η=1). Apparently, the optimum dose in the case of involving small regions has an error of about 1% with respect to the original optimum dose. The error of about 1% is equivalent to a size error of approximately 4 to 5 nm, which is not negligible.

For the small regions where case 2 continues, the same is true if "line" is taken as "space" so that the dose error becomes −1% and the size error becomes −(4 to 5) nm.

The above example involves a relatively small error, but if the side length of each small region in the pitch direction is doubled and the size of L/S becomes proportionally greater, the error is doubled accordingly, yielding a size error of 8 to 10 nm. While the ratio of L/S in the former example is 1:1, this ratio becomes 2:1 in the latter example, resulting in a greater error.

Referring now to FIGS. 3 to 6C, a description will be given of the difference between the effect of the above-described proximity effect correction method (conventional method) and that of a proximity effect correction method according to the first embodiment of this invention.

Figure 3:
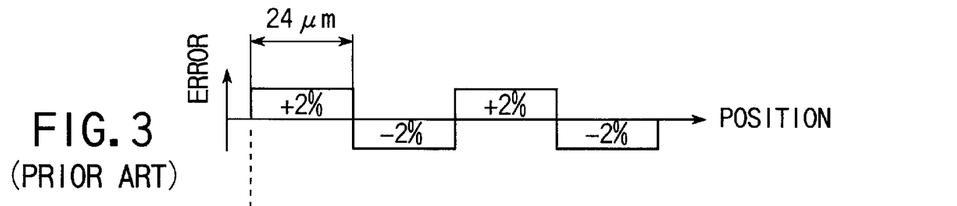
FIG. 3 is a diagram showing a position dependency of an area error produced in the layout in FIG. 2B when prior art is used.

FIG. 3 shows how the problem of the conventional method is brought about. A region with an area error of, for example, +2% stretches over about 24 μm as mentioned above, and a region with an area error of −2% likewise stretches over about 24 μm.

Figure 4A:
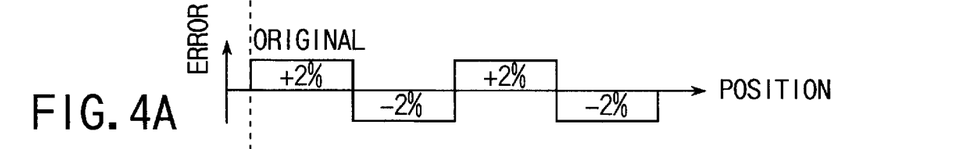
FIGS. 4A through 4C are diagrams showing a position dependency of an area error produced in the layout in FIG. 2B when (0, ½) mesh shifting of this invention is used.
Figure 4B:
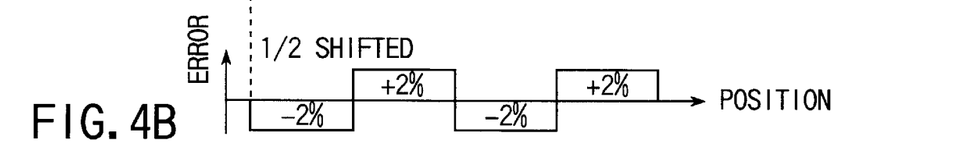

FIGS. 4A through 4C show the system according to this invention. FIG. 4A shows a case where the area is acquired using the original pattern, which is similar to the conventional method shown in FIG. 3. The whole pattern is shifted rightward by a half of the mesh width of small regions aligned as shown in FIG. 2B and the area of each small region is acquired, yielding the distribution of area errors as shown in FIG. 4B.

Figure 4C:
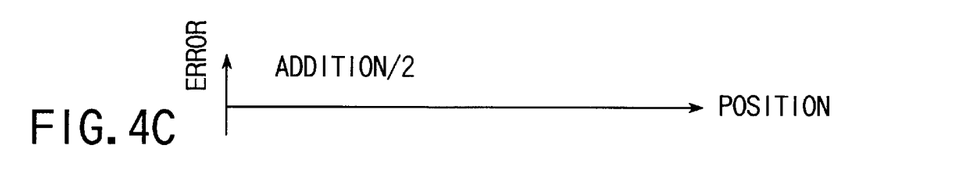

FIG. 4C shows the values of area errors when the result of adding the errors in FIG. 4A and those in FIG. 4B is divided by 2. As apparent from FIG. 4C, the errors in FIG. 4A cancel out those in FIG. 4B, so that there is an area error of 0 over the entire region.

Figure 5A:
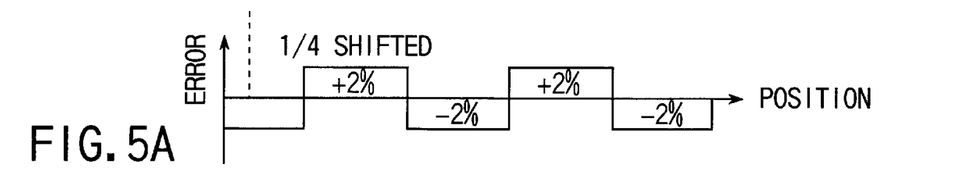
FIGS. 5A through 5C are diagrams showing a position dependency of an area error produced in the layout in FIG. 2B when (−¼, ¼) mesh shifting of this invention is used.
Figure 5B:
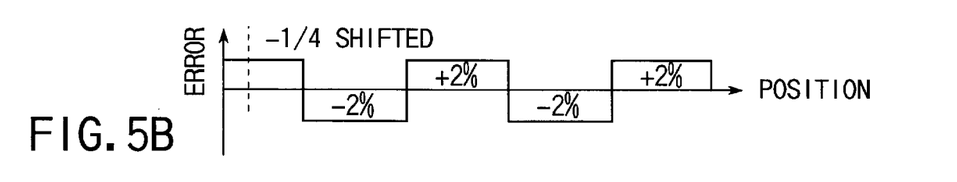
Figure 5C:
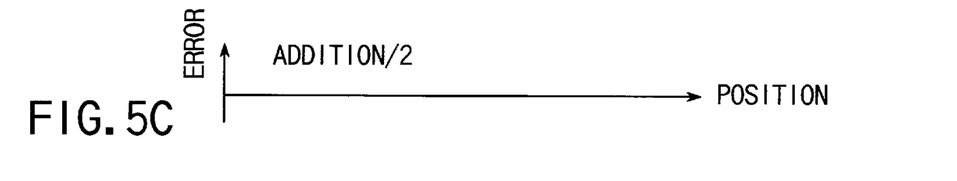

Alternatively, the whole pattern may be shifted rightward by ¼ of the mesh width of the small regions as shown in FIG. 5A, followed by the leftward shifting of the whole pattern by ¼ of the mesh width of the small regions as shown in FIG. 5B, and the values of area errors when the result of adding the errors in FIG. 5A and those in FIG. 5B may then be divided by 2. FIG. 5C shows the values of area errors then.

The influence of the proximity effect can be effectively corrected by computing the amount of backward scattering electrons through convolution using the areas of pattern segments small region by small region which is area-error free (or whose area error is suppressed) and acquiring the optimum dose based on the result of the calculation.

Depending on the amount of shifting of a pattern, the error may not completely become zero. Such a case is illustrated in FIGS. 6A–6C.

Figure 6A:
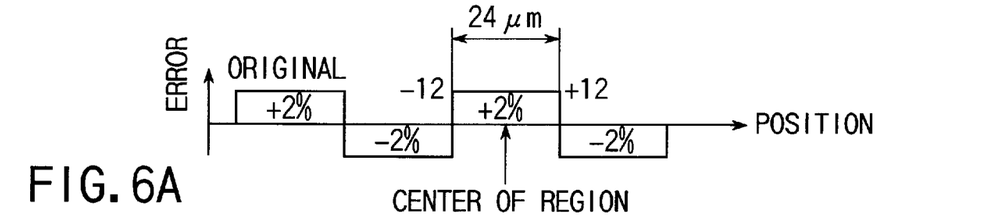
FIGS. 6A through 6C are diagrams showing a position dependency of an area error produced in the layout in FIG. 2B when (0, ¼) mesh shifting of this invention is used.

FIG. 6A shows a case where the area is acquired using the original pattern, which is similar to the conventional method shown in FIG. 3.

Figure 6B:
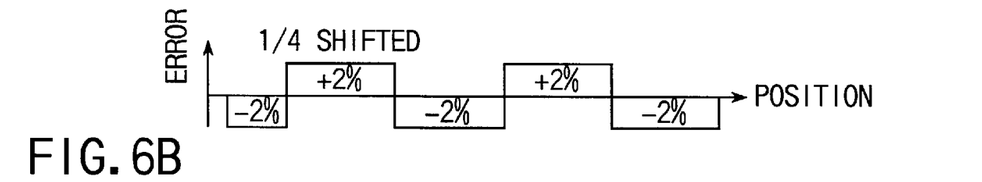

Next, the whole pattern is shifted rightward by a half of the mesh width of small regions and the area of each small region is acquired, yielding the distribution of area errors as shown in FIG. 6B.

Figure 6C:
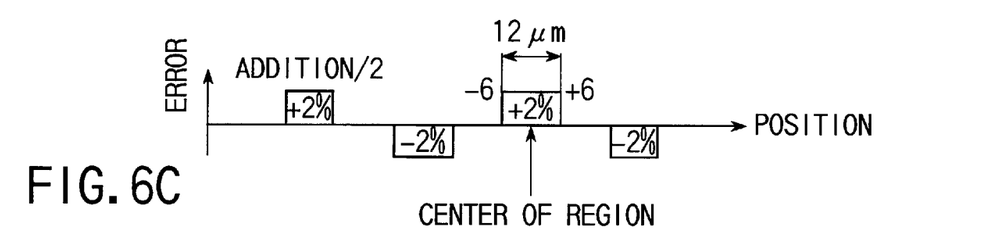

FIG. 6C shows the values of area errors when the result of adding the errors in FIG. 6A and those in FIG. 6B is divided by 2. As apparent from FIG. 6C, the errors in FIG. 6A cancel out those in FIG. 6B, so that there are regions with an area error of 0 with regions of errors of 2% and −2% on both sides of each error-free region. The length of the error-present region 12 μm, a half the original length of 24 μm.

Thereafter, the amount of backward scattering electrons is calculated through convolution using this area. The dose error becomes worst in the center of a region where an area error occurs. In this respect, an attention should be paid to the center of the region.

Given that the spreading of backward scattering is 10 μm, the area of integration in the convolution is carried out over a region of −10 μm to +10 μm around the center of that error-present region in the conventional method. On the other hand, according to the ¼ mesh shifting scheme, integration in the convolution is carried out over a region of −6 μm to +6 μm because no integration is needed over the error-free region. The convolution value of the latter method becomes approximately 0.6 of the former convolution value, so that the area error becomes approximately 0.6×2%=1.2%.

Accordingly, the dose error is suppressed to about 1% by the convention method whereas it is suppressed to about 0.6% by the method of the present invention.

The first embodiment of this invention shifts a pattern and performs averaging to eliminate an area error or spatially average the area error, thereby making the error-present regions smaller. This suppresses a convolution error and eventually an error in the set dose, thus contributing to improving the pattern writing precision.

Although a pattern is shifted rightward by a ½ mesh and an error for each region is calculated by averaging the shifted pattern and the original pattern, a pattern may be shifted rightward by a ¼ mesh and then shifted leftward by a ¼ mesh, followed by averaging of both shifted patterns. As another example, after four kinds of shifts of ¼, ⅓, −¼ and −1/3 meshes may be performed followed by averaging of the four shifted patterns.

(Second Embodiment)

A second embodiment employs an electron beam system with an acceleration voltage of 50 kV. Since the layout of the electron optics, the substrate to be exposed and so forth does not differ from that of the prior art, it will not be illustrated. A variable shaped beam is used with a shot having the maximum size of 1×1 μm, and the dose time can be adjusted shot by shot. The minimum dose time is 50 nsec and the dose time is adjustable by a unit of 1 nsec. A stage continuous moving system is employed so that a pattern is written while moving the stage at a constant speed.

Figure 7:
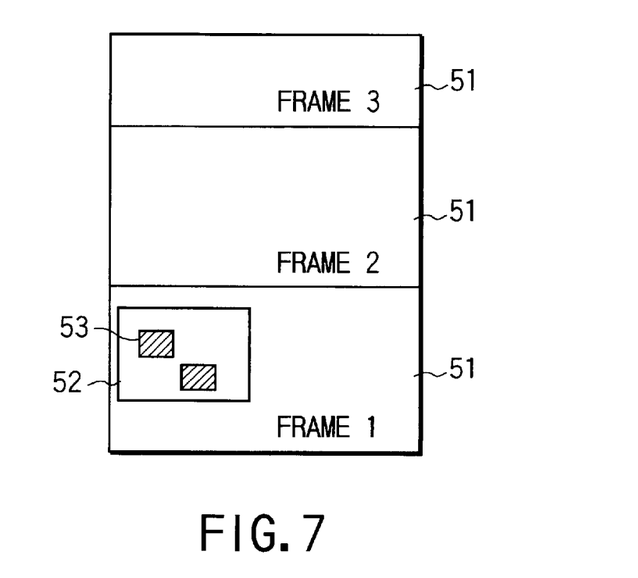
FIG. 7 is a diagram illustrating the relationship among control units (frame, subframe and shot) in pattern writing according to this invention.

Referring to FIG. 7, the writing method and its structural units will be explained. Each region that can be written by stage continuous moving is called a frame. Pattern writing in each frame 51 is carried out for each region 52 called a subfield. The subfield is equivalent to the region where a pattern can be written by controlling the position of a shot 53 by using a sub deflector. The size of the subfield is 64 μm×64 μm in this system. The position of the subfield 52 is controlled by a main deflector.

Figure 8:
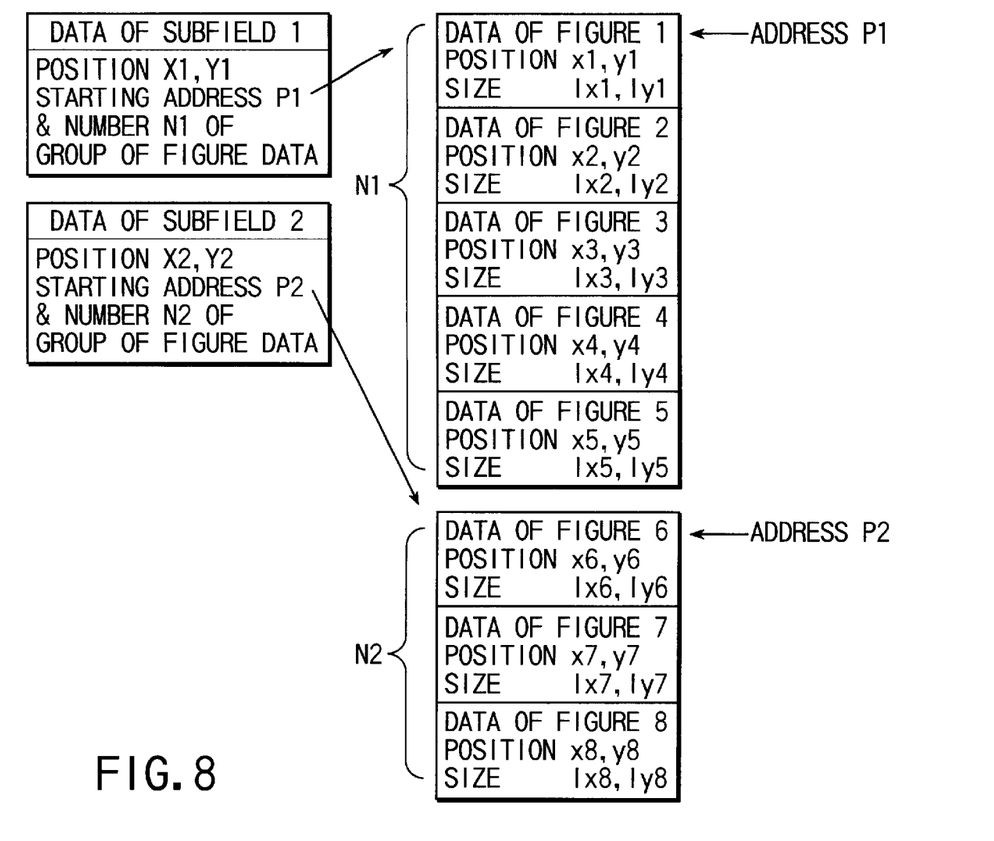
FIG. 8 is a diagram depicting a data structure in pattern writing according to this invention.

FIG. 8 exemplifies data for writing a pattern. Data for writing a pattern consists of a group of data of subfields and a group of data of figures.

This system uses exclusive hardware for proximity effect correction. The process is implemented frame by frame. In the calculation for proximity effect correction, calculation for frame correction takes place prior to writing. In the structure in FIG. 7, for example, the first frame is written by using a previously-calculated optimum dose. While the first frame is being written, the proximity effect correction circuit is carrying out calculation for proximity effect correction for each unit region in the second frame. This proximity effect correction is performed in a shorter time than the pattern writing. When writing the first frame is completed, the second frame is written with the optimum dose that reflects the calculated proximity effect correction during the writing. The third frame is likewise written with the optimum dose that is originated from the calculated proximity effect correction performed during the writing of the previous frame. Real-time proximity effect correction is executed this way.

Figure 9:
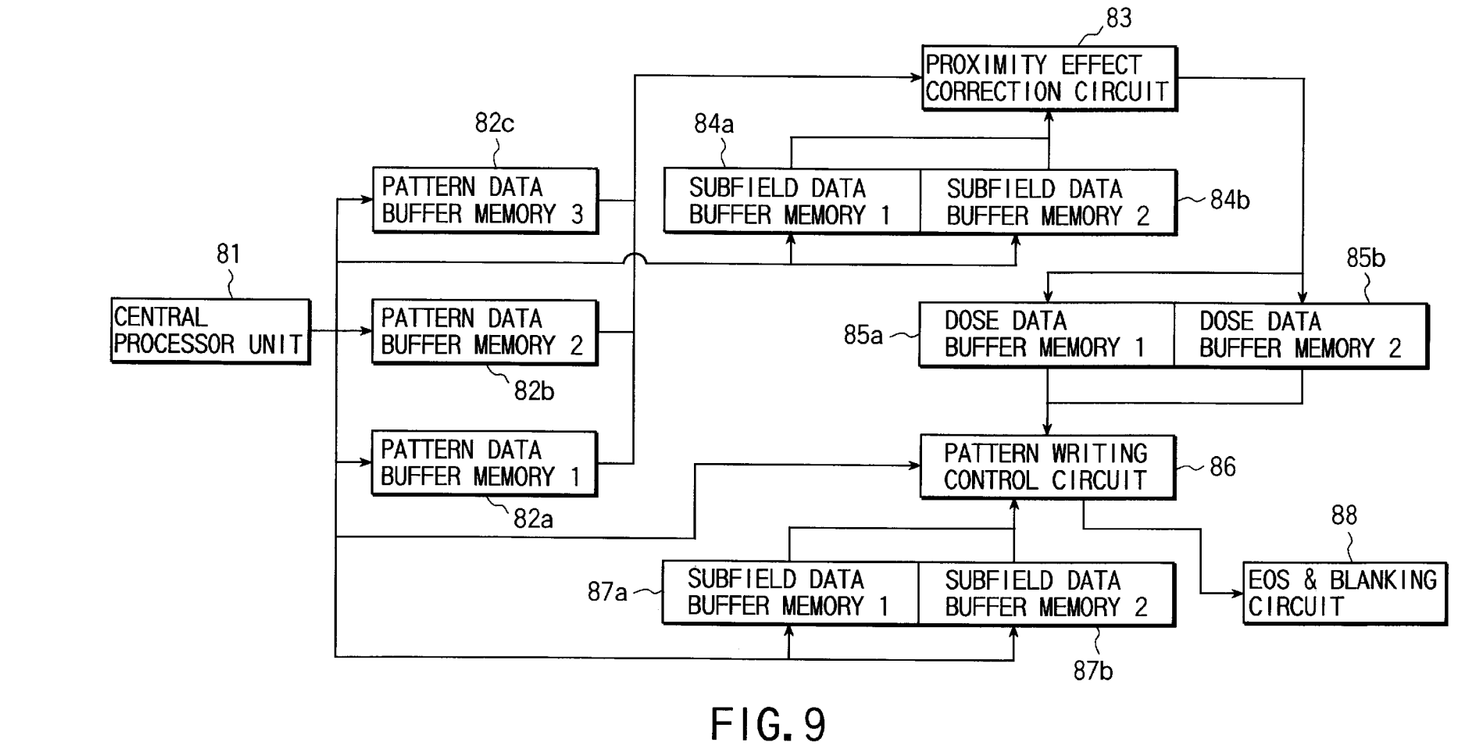
FIG. 9 is a block diagram of a pattern writing system according to this invention which implements proximity effect correction (calculation of the optimum dose) and pattern writing in parallel.

FIG. 9 presents a structural diagram of the system that is associated with proximity effect correction and pattern writing. This system comprises a control computer (CPU) 81, pattern data buffer memories 82a to 82c, a proximity effect correction circuit 83, subfield data buffer memories 84a and 84b, dose data buffer memories 87a and 87b, a pattern writing control circuit 86, subfield data buffer memories 87a and 87b, and an EOS (Electron Optics System) and blanking circuit 88.

To ensure parallel processing, this system employs double banks of the dose data buffer memories 85a and 85b in association with the process illustrated in FIG. 7. Figure data is stored in triple banks of the buffer memories 82a, 82b and 82c, and is sequentially used by the proximity effect correction circuit 83 and the pattern writing control circuit 86. Subfield data has such a structure that it is separately sent to the pattern writing control circuit 86 and the proximity effect correction circuit 83. The transfer of those data is controlled by control software which runs on the control computer 81.

Figure 10:
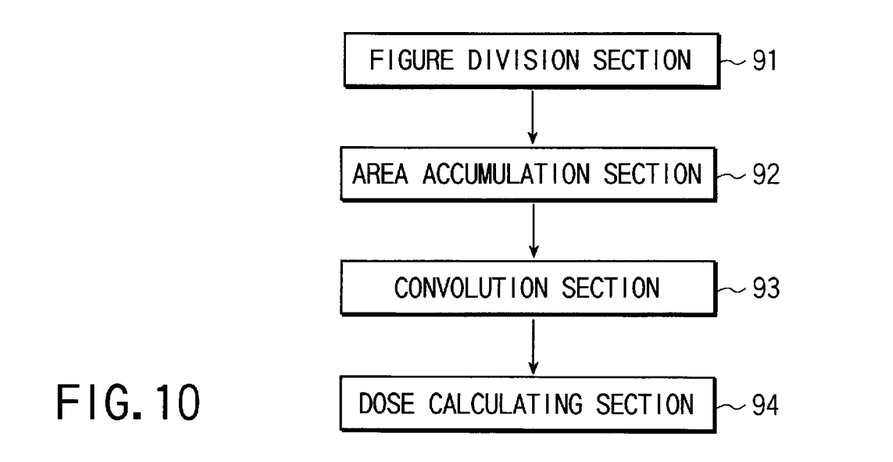
FIG. 10 is a diagram illustrating the flow of processes in a proximity effect correction circuit.

FIG. 10 is a schematic block diagram of the proximity effect correction circuit that comprises (1) a section which includes a figure division section 91 and area accumulation section 92 and calculates the area of each small region for proximity effect correction using the figure data and subfield data, (2) a section which calculates the amount of backward scattering electrons U(x) using the acquired area data (convolution section 93), and (3) a section which calculates the optimum dose from the amount of backward scattering electrons U(x) (dose calculation section 94).

Figure 11:
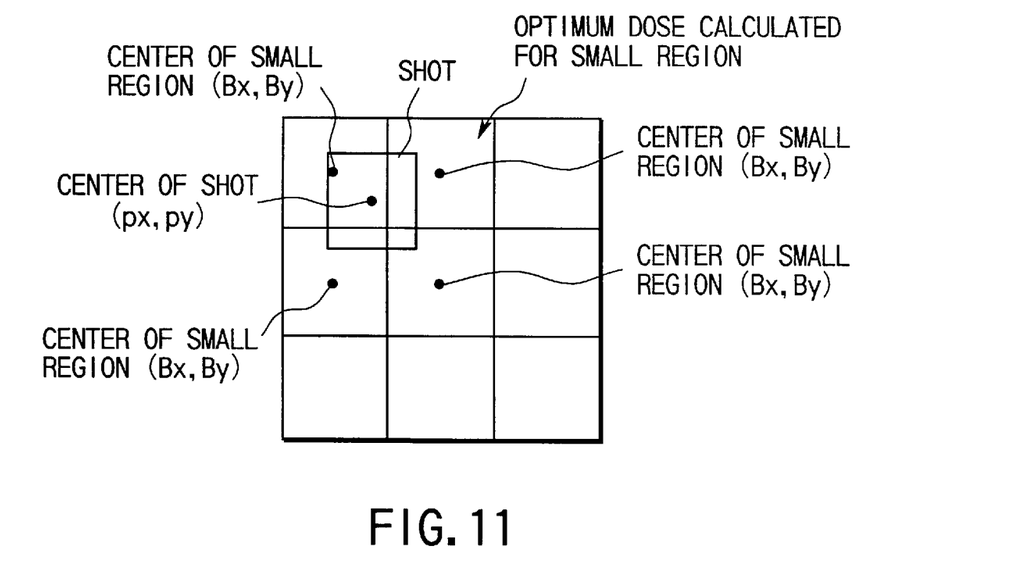
FIG. 11 is an exemplary diagram illustrating how to assign the dose of electrons to each shot using data on a calculated optimum dose.

FIG. 11 illustrates a method for setting a dose for a shot using the thus calculated dose data. Setting the dose is carried out in the proximity effect correction circuit (reference numeral "83" in FIG. 9). The proximity effect correction circuit calculates the coordinates of the center of a shot and specifies a small region in which the center of the shot is located. Then, the proximity effect correction circuit determines the optimum dose for that small region as the optimum dose of that shot. The proximity effect correction circuit is designed in such a way that the difference between the coordinate system of a pattern and the coordinate system of small regions where dose data is stored can be set in this circuit in order to match the former coordinate system with the latter one.

The figure division section 91 (FIG. 10) computes an area to be allocated to each small region for each figure. For example, a figure which is irradiated from the electron optics system is divided into figure segments at the boundaries of small regions, and the areas of the figure segments are calculated and are recorded small region by small region. Next, another figure is similarly divided, the area of each figure segment is accumulated on the area of the associated, recorded small region. The size of a small region for which the dose and area are to be calculated is 1.0 μm and 1.0 μm.

This embodiment can carry out real-time proximity effect correction and takes the following specific structure.

The area accumulation section 92 is designed to accumulate ½ of the values of the calculated areas. Making the values of the areas a half can be achieved by bit shifting the value of each area. That is, this process can easily be realized by a bit shifter.

Figure 12A:
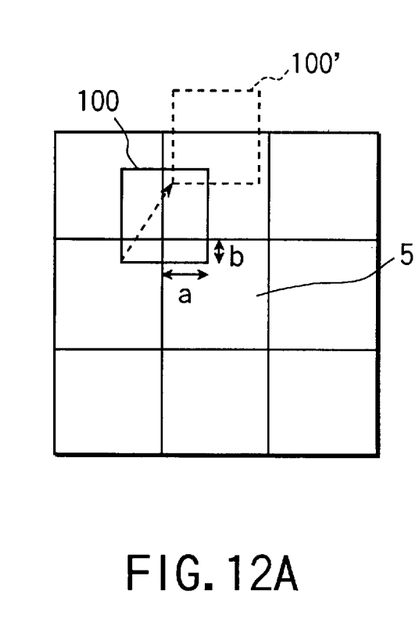
FIG. 12A is an exemplary diagram for explaining an area calculation in the (0, ½) mesh shifting scheme of this invention.
Figure 12B:
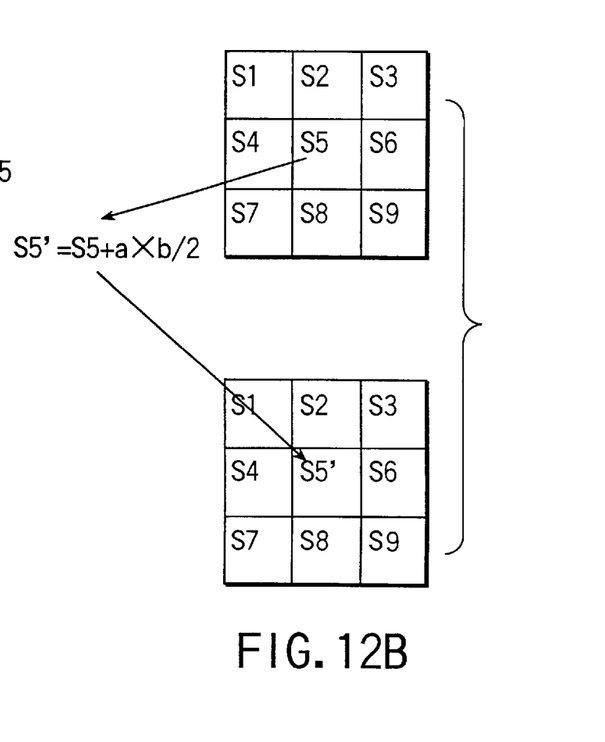
FIG. 12B is an exemplary diagram illustrating how an area calculation is carried out in the proximity effect correction circuit.

The accumulation of areas in this structure is carried out in the following procedures (see FIGS. 12A and 12B). A FIG. 100 is divided into a plurality of small regions (four small regions in this example), the area (a×b) of a portion contained in a small region 5 is calculated (FIG. 12A) and this area (multiplication result) is then divided by 2. A sum S5 of the areas that have been calculated so far for the region 5 of another figure is read out from the memory and is added to the result of the division, a×b/2, (S5+a×b/2). The acquired value is overwritten on the memory (FIG. 12B). As a result, S5 is changed to S5'=S5+a×b/2.

As the above step is carried out for all the figures (e.g., 100 in FIG. 12A) and all the figures that are the former figures shifted by a mesh shift (½, ½) (100' in FIG. 12A), the process of accumulating the areas can be accomplished.

To shift a figure by a ½ mesh (0.5 μm), first, the control program in the CPU 81 sends the subfield data of an arbitrary subfield A to the proximity effect correction circuit. Then, the control program sends the subfield data of the subfield A again with the position X1, X2 of the origin of the subfield rewritten to X1+0.5 μm, X2+0.5 μm.

Adding 0.5 μm to the position is equivalent to substantially shifting all the patterns in the subfield rightward by a half of the mesh width of the small region. As the first subfield sent has the origin unshifted (zero shift), the two processes effectively achieves averaging of the area data.

In this case, the process of the entire pattern has been carried out twice, one without a shift and the other with a shift of 0.5 μm, so that the whole pattern is substantially shifted rightward by 0.25 μm. Its influence is relatively soft and may be neglected. To implement a precise process, however, 0.25 μm which is the difference between the coordinate system of a pattern and the coordinate system of small regions where dose data is stored has only to be set in the pattern writing control circuit.

The second embodiment has been described as having a capability of adding an area error at the original position and an area error in a case where a pattern is shifted in the x direction and y direction by a ½ mesh. Expressing this addition by an addition of (0, 0) and (½, ½), this invention is not limited to the addition of the above-described shift but may carry out an addition of (−¼, −¼) and (¼, ¼). Alternatively, this invention may carry out an addition of three kinds of data of (0, 0), (−¼, −¼) and (¼, ¼) or four kinds of data of (−¼, −¼), (−¼, ¼), (¼, −¼) and (¼, ¼).

It is desirable that the sum of the absolute values of the shift amounts be equal to or smaller than a ½ mesh in the x-axial direction and be equal to or smaller than a ½ mesh in the y-axial direction as apparent from the aforementioned combinations. It is further desirable that the number of shifts be an even number including the original position (zero shift) and the sum of the shift amounts in at least one axial direction be zero. In adding n pieces of data, each piece of data may be taken as 1/n in the addition as done in the second embodiment or the result of adding the original data may be divided by n.

(Third Embodiment)

Although the areas of a group of figures are calculated while shifting the positions of the figures group by group within a range smaller than the size of a small region in the second embodiment, areas may be computed figure by figure or shot by shot which is obtained by dividing the figure.

Figure 13:
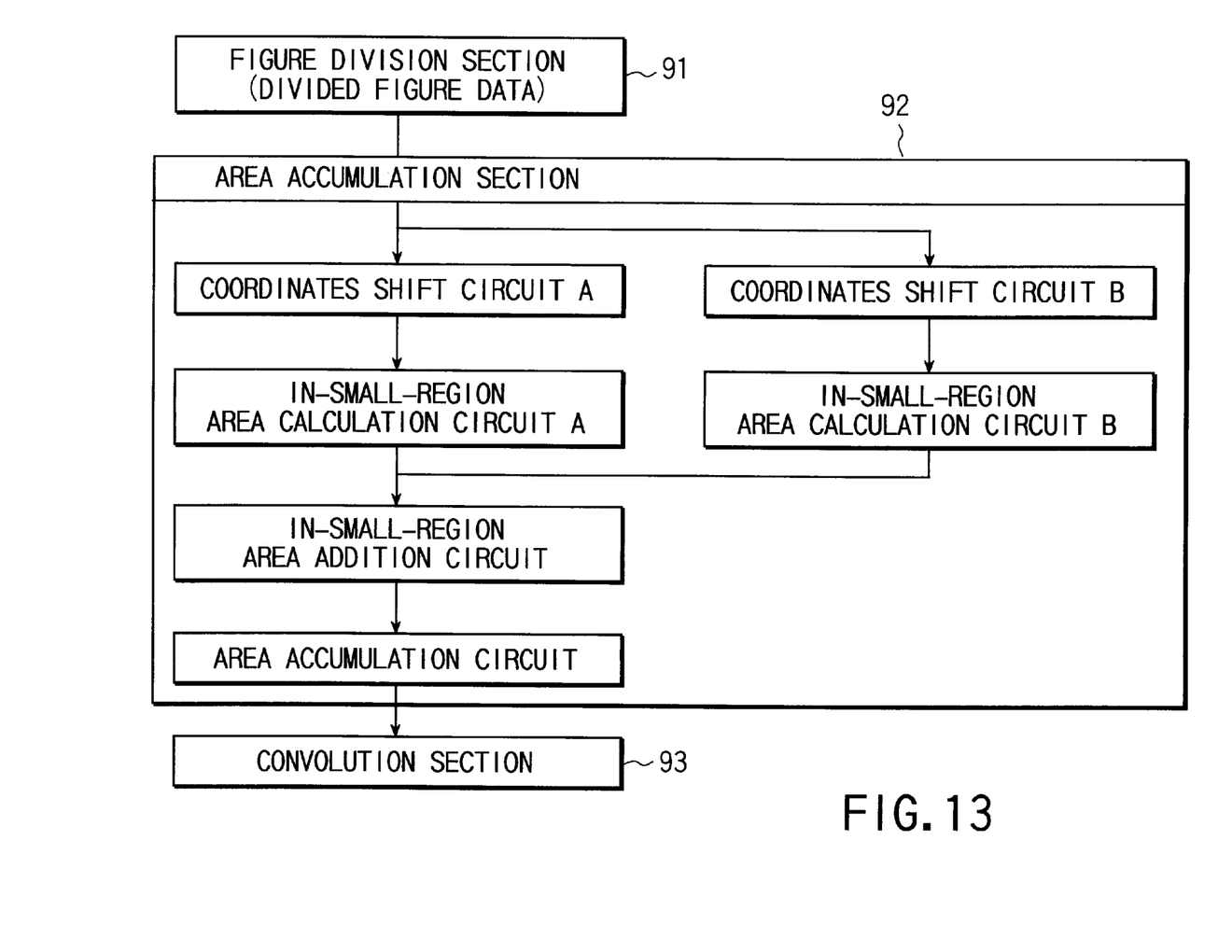
FIG. 13 is a diagram illustrating the structure of a part of a proximity effect correction circuit according to a third embodiment of this invention and the flow of processes in the circuit.
Figure 14A:
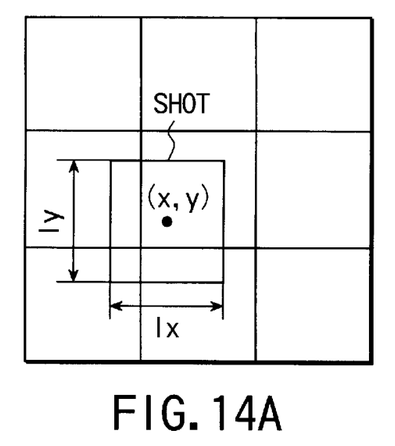
FIGS. 14A and 14B are diagrams showing shifting of a shot according to the third embodiment.

As the third embodiment, a system which calculates areas shot by shot will be discussed below. FIG. 13 shows one part of the proximity effect correction circuit to which the characterizing portion of this embodiment is added. In FIG. 13, a figure (shot) divided by the figure division section 91 is input to the area accumulation section 92. The input shot has information such as the coordinates (x, y) of the shot's center and size (lx, ly), as shown in FIG. 14A.

Figure 14B:
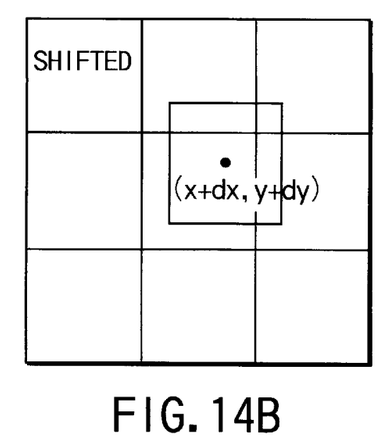
Figure 14C:
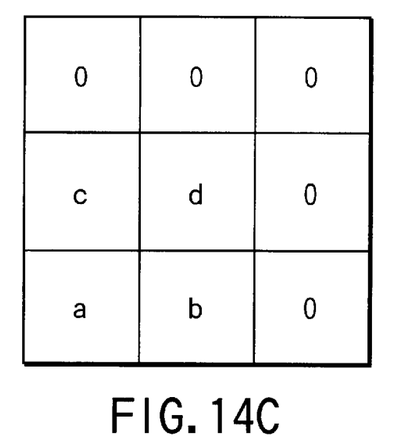
FIGS. 14C and 14D are diagrams showing the values of the areas of individual small regions in FIGS. 14A and 14B.
Figure 14D:
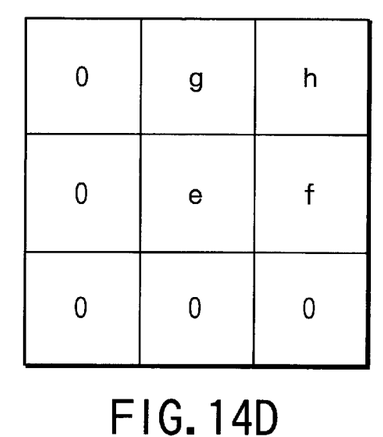
Figure 14E:
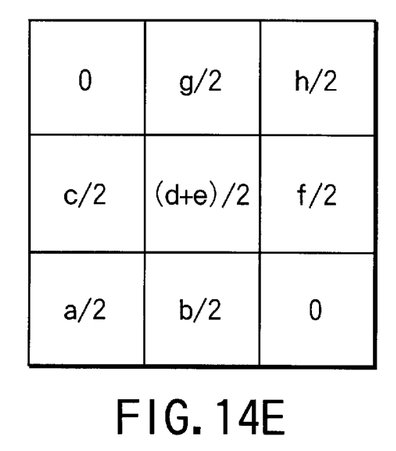
FIG. 14E is a diagram showing the values of the areas of individual small regions which are acquired by adding the values of the areas in FIGS. 14C and 14D and then dividing the resultant values by 2.

Although the control program in the CPU 81 issues a command to shift the position of the origin of a subfield by a predetermined amount in the second embodiment, coordinates shift circuits A and B in the area accumulation section 92 shift the coordinates in the third embodiment. In this example, the coordinates shift circuit A does not perform shifting (the figures stays as shown in FIG. 14A) but the coordinates shift circuit B shifts the coordinates by (dx, dy) (FIG. 14B). In-small-region area calculation circuits A and B calculate the areas inside the respective small regions.

An in-small-region area addition circuit adds the calculated in-small-region areas small region by small region and obtains a ½ of the sum. This operation can easily be accomplished by an electric adder and a bit shifter. The result of the addition is accumulated by an area accumulation circuit for each frame and is recorded in an area storage memory (not shown) corresponding to the frame. The area with the coordinates shifted shot by shot is acquired this way for every shot (figure) in the frame.

The acquired values of the areas are subjected to convolution and an optimum dose can be acquired by correcting a predetermined dose based on the result of the convolution. Although the values of areas whose coordinates have been shifted are calculated in parallel and are then added in the third embodiment, the calculation of the areas may be carried in series or in a time-divisional manner without departing from the concept of adding the values of areas with different shift values. The shift amount (dx, dy) may take various values as mentioned in the foregoing description of the second embodiment.

Although several embodiments of this invention have been described herein, it should be apparent to those skilled in the art that this invention may be embodied in many other specific forms without departing from the spirit or scope of the invention. Although this invention is adapted to electron beam writing in the second and third embodiments, this invention can of course be adapted to writing with a charged particle beam, such as an ion beam, or other writing systems as well. For instance, an apparatus for inspecting defects of a reticle with a light beam compares an optical image obtained by simulation of an LSI pattern with the actual optical image to determine if there is a defect. If this invention is adapted to this technology, an optical image is simulated by computing the area of each small region and performing convolution on the calculated areas. In this case, like in the above-described conventional case, an area error occurs to which error suppression of this invention can be used.

Further, optical proximity effect correction may employs steps of calculating the area of each region, computing an optical image and performs correction using those calculated data. In this case, an area error likewise occurs to which error suppression of this invention can be used.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A pattern writing method comprising the steps of:
    dividing a region of a to-be-exposed substrate on which a pattern is to be written into a plurality of small regions;
    relatively shifting coordinates of said pattern and said plurality of small regions n times (n: an integer equal to or greater than 2) within a shift range whose absolute value is smaller than a size of said plurality of small regions and computing an area of at least one portion of said pattern located in each of said plurality of small regions in each of said n times, thereby acquiring n pieces of area data;
    computing an optimum dose for said at least one portion of said pattern based on said n pieces of area data; and
    writing said pattern on said to-be-exposed substrate based on said optimum dose.

2. The pattern writing method according to claim 1, wherein said optimum-dose computing step includes the step of computing an amount of backward scattering electrons based on said n pieces of area data.

3. The pattern writing method according to claim 2, wherein said backward-scattering-electrons-amount computing step includes the step of computing said amount of backward scattering electrons by convolution based on said n pieces of area data and spreading of backward scattering.

4. The pattern writing method according to claim 2, wherein said backward-scattering-electrons-amount computing step computes said amount of backward scattering electrons by an equation given below based on said area:

$$U(x)=\int S(x')\exp\{-(x-x')^2/\sigma b^2\}dx'$$

where $U(x)$ is said amount of backward scattering electrons, $S(x')$ is said area, $x$ and $x'$ are coordinates and $\sigma b$ is spreading of backward scattering.

5. The pattern writing method according to claim 1, wherein said optimum-dose computing step computes said optimum dose by an equation given below based on said amount of backward scattering electrons:

$$D(x)=C/(\tfrac{1}{2}+\eta U(x))$$

where $D(x)$ is said optimum dose, $\eta$ is a ratio of an exposure amount sensitive to a resist by forward scattering electrons to that by backward scattering electrons and $C$ is a constant.

6. The pattern writing method according to claim 1, wherein said optimum-dose computing step includes the steps of:
    multiplying each of said n pieces of area data by 1/n and then adding resultant areas together to thereby acquire an added area; and
    computing said optimum dose based on an amount of backward scattering electrons acquired based on said added area.

7. The pattern writing method according to claim 1, wherein said optimum-dose computing step includes the steps of:

adding n amounts of backward scattering electrons respectively obtained based on said n pieces of area data to thereby acquire an added amount of backward scattering electrons; and computing said optimum dose by multiplying said added amount of backward scattering electrons by 1/n.

8. The pattern writing method according to claim 1, wherein said plurality of small regions are rectangles of a same size which satisfy $$0 \leq dx \leq lx$$

and $$0 \leq dy \leq ly$$

where lx is a length of x-axial sides, ly is a length of y-axial sides perpendicular to said y-axial sides, dx is an absolute value of an amount of a relative shift of each of said plurality of small regions in an x-axial direction and dy is an absolute value of an amount of a relative shift of each of said plurality of small regions in a y-axial direction.

9. The pattern writing method according to claim 8, wherein a total of absolute values of amounts of n relative shifts is equal to or smaller than lx/2 in said x-axial direction and is equal to or smaller than ly/2 in said y-axial direction.

10. The pattern writing method according to claim 8, wherein said n is an even number and a total of said amounts of said n shifts in at least one of said x-axial direction and said y-axial direction is zero.

* * * * *